United States Patent [19]

Nourai et al.

[11] Patent Number: 4,833,415

[45] Date of Patent: May 23, 1989

[54] APPARATUS AND METHOD FOR DETECTING CURRENT LEAKAGE THROUGH INSULATING STRUCTURE

[76] Inventors: Ali Nourai, 6332 Taneramore Ct., Dublin, Ohio 43017; Jan P. Lenko, 9935 Melody La., Pickerington, Ohio 43147

[21] Appl. No.: 141,790

[22] Filed: Jan. 11, 1988

[51] Int. Cl.$^4$ .................... G01R 31/02; G01R 31/12
[52] U.S. Cl. .................... 324/557; 324/551
[58] Field of Search ............ 324/557, 559, 551, 554, 324/558, 552, 553

[56] References Cited

U.S. PATENT DOCUMENTS

| | | | |
|---|---|---|---|
| 2,077,357 | 4/1937 | Doolittle | 324/552 |
| 2,307,499 | 1/1943 | Frakes | 324/552 |
| 3,159,240 | 12/1964 | Miller, Jr. | |
| 3,320,524 | 6/1967 | Miller, Jr. | |
| 3,439,265 | 4/1969 | Strom | 324/552 |
| 3,449,668 | 6/1969 | Blackwell et al. | |
| 3,514,695 | 5/1970 | Skarshaug | |
| 3,612,994 | 10/1971 | Hooper | |
| 3,710,242 | 1/1973 | Povey | 324/552 |
| 3,769,578 | 10/1973 | Staley | |
| 4,080,561 | 3/1978 | Thompson | |
| 4,546,310 | 10/1985 | Chatanier | 324/62 R |

*Primary Examiner*—Reinhard J. Eisenzopf
*Assistant Examiner*—Jose M. Solis
*Attorney, Agent, or Firm*—Michael Sand Co.

[57] ABSTRACT

Apparatus for separating the amount of resistive leakage current passing through an insulating portion (14) of an aerial boom (12) which is in contact with an electrical line includes a first current collector band (24) and a second current collector band (22). A first current path extends from the first current collector band to ground. A second current path extends from the second current collector band to ground. A first current flows through the first current path due to current that leaks through the insulating portion of the boom as well as capacitance effects. A second current flows through said second current path due to capacitance effects caused by nearby sources of extraneous ambient electrical energy. A converter box (44) converts the first and second currents into representative first and second voltage signals. The first and second voltage signals are transmitted to an electronics and readout box (70) by a pair of shielded cables (50 and 52) or other conventional means such as optical fibers. In the electronics and readout box (70) an adjustable gain circuit (92) adjusts the magnitude of the second voltage signal and the first and adjusted second voltage are passed through a conventional differential amplifier circuit (82) which serves to perform vector subtraction of the voltage signals representative of $I_1$ and $I_2$ and output a resultant difference voltage signal to a display circuit (86). When the gain of the adjustable gain circuit is set to minimize the resultant difference voltage, the difference voltage is the resistive leakage current flowing down the insulating portion (143) of the boom without the ambient capacitively coupled currents.

12 Claims, 2 Drawing Sheets

APPARATUS AND METHOD FOR DETECTING CURRENT LEAKAGE THROUGH INSULATING STRUCTURE

TECHNICAL FIELD

This invention relates to devices and method for measuring resistive current leakage through insulating structures. Particularly the invention relates to a technique for measuring resistive current leakage through insulating structures used in proximity to sources of extraneous capacitive current such as insulating booms on electrical utility trucks and insulators on substation buses and transmission lines.

BACKGROUND ART

Aerial booms which are used to lift workers to elevated heights for working on electrical transmission lines generally include special electrically insulating boom sections. These insulating sections operate to insure that there is no electrical path from the top of the boom to ground. The insulating portion of the boom allows a worker to work directly on the line as the worker is at the same electrical potential. If the electrical resistance of the insulating boom portion breaks down, a worker could experience electric shock and injury.

The device shown in U.S. Pat. No. 3,320,524 attempts to minimize the effects of ambient electrical current by using a shielded cable between the conductive rings and the ammeter which measures the current flow. This however, does not eliminate the problem because the rings themselves are subject to the capacitive coupling. Thus, the readings at the ammeter do not reflect the actual resistive current leakage through the insulating portion of the boom.

Another system for testing the electrical integrity of an insulating boom portion is shown in U.S. Pat. No. 3,514,695. In this system, the bucket at the top end of the boom where the worker normally stands is placed in contact with an electrical line before the worker ascends. A pole extending from the bucket is placed in contact with the electrical line and current flow through the pole is measured. The current through the pole is considered to be equal to the flow through the insulating portion of the boom. The deficiency in this approach however, is the same as the system previously discussed. The reading does not give an acurate indication of current flow through the insulating portion on the boom when there are nearby sources of electrical energy, due to capacitive coupling.

U.S. Pat. No. 4,080,561 discloses a system for testing the electrical resistance of an insulating boom section. The system tests the boom in an out-of-service condition. This approach is not as good as monitoring electrical leakage through the boom before and during each use, as the resistance of the boom can change with varying conditions, such as condensation of water or cracking.

A system which attempts to minimize the effects of ambient electrical currents in measuring electrical leakage through an insulating boom portion is disclosed in U.S. Pat. No. 3,769,578. This system uses a pair of superimposed collector bands located on the interior and exterior of an insulation boom. These band are similar to those shown in U.S. Pat. Nos. 3,159,240 and 3,320,524 previously discussed. However, this later patent also employs a guard electrode which extends around the outside of the outer band. The guard electrode is grounded but is not in electrical contact with the other bands. The purpose of the guard electrode is to absorb ambient currents so that the current detected by the bands is only the electrical current which passes through the insulating boom portion. A deficiency of this system is that the guard electrode cannot fully shield the underlying collector bands from ambient currents and readings of leakage current through the boom may be inaccurate. A more serious problem is that applicants observation of a similar system has disclosed that a portion of the leakage current traveling through the insulating boom portion can be drained off by the guard electrode so that current actually passing through the boom may go undetected.

In addition to aerial booms, there are many other applications in electrical systems in which electrically resistive structures are used. It is usually desirable to keep leakage current through such structures to a minimum and structures with high leakage should be repaired or replaced. Because these structures are often located in areas of high ambient capacitive coupling, there has been no effective and accurate ways to measure the amount of resistive current leakage.

Thus, there exists a need in the prior art for an apparatus and method that can be used to separate the resistive leakage current through an electrically resistive structure for measurement, that is not effected by the presence of ambient capacitive coupling.

DISCLOSURE OF THE INVENTION

It is an object of the present invention to provide a method for the collection of the ambient capacitively coupled current for subtraction from the total leakage current through an electrically resistive structure.

It is a further object of the present invention to provide an apparatus that can be used with many types of electrically resistive structures to provide a measurement of the resistive leakage current component.

It is a further object of the present invention to provide a method for subtracting the extraneous capacitively coupled current from the leakage current of the electrically resistive structure to acurately indicate the resistive leakage current through the electrically resistive structure.

Further objects of the present invention are made apparent in the following best mode for carrying out the invention and the appended claims.

The foregoing objects are achieved in the preferred embodiment by a first set of collector bands including electrically connected inner and outer bands mounted on the inner and outer perimeters of the lower end of a hollow insulating boom portion on an aerial man lifting device. This first set of collector bands also includes conductive collars which extends around items passing through the interior of the hollow boom, which may be controll devices such as rods and hoses. This first set of collector bands is designed and is presently being used to intercept the current leaking down the insulating boom portion as well as the capacitively coupled currents. A second primary collector band is mounted on the insulating boom portion adjacent to but behind the first set of conventional collector bands such that it would not collect the resistive current leaking down the insulating boom portion from the source of electrical energy at the first location. The second collector band is a metal band extending around the outer perimeter of the boom The second collector band intercepts only the ambient capacitive currents as all of the resistive leakage current is intercepted by the first set of collector bands. The first set of collector bands collects virtually all of the resistive leakage current because it is closer to the first location.

A first shielded cable extends from the first set of collector bands to a converter box mounted on a conductive lower portion of the boom. A second shielded cable extends from the second collector band to the converter box. The shielding on both cables is grounded to prevent the introduction of ambient electrical currents into a conductive wire inside the cables.

In the converter box the first electrical current from the first collector band and the second electrical current from the second collector band are passed to ground through grounding resistors. An electrical voltage is produced across each grounding resistor that is proportional to the currents collected by the first and second collector bands.

Voltage outputs from the grounding resistors, representative of the currents collected by the collector bands, are transmitted from the convertor box to an electronics and readout box which is located on a lower portion of the man lifting device. The transmission of the voltages from the converter box to the electronics box can be achieved by using two shielded cables or implemmenting other conventional means such as optical fibers equipped with electro/optic convertors at both ends.

In the electronics and readout box at ground level a conventional differential amplifier circuit calculates the vector differences between the voltage signals representative of the first and second currents collected by the first and second collector bands. The differential amplifier circuit outputs a resultant difference voltage which is representative of the resistive leakage current through the boom. A pair of meters are used to display the total current collected by the first set of collector bands and the amount of the resistive leakage current through the insulating portion of the boom. BRIEF DESCRIPTION OF DRAWINGS Preferred embodiments of the invention illustrative of the best modes in which applicants have contemplated applying the principles are set forth in the following discription, are shown in the drawings and are particularly and distinctly pointed out and set forth in the appended claims.

Similar numerals refer to similar parts throughout the drawings.

BEST MODE FOR CARRYING OUT THE INVENTION

Figure 1:
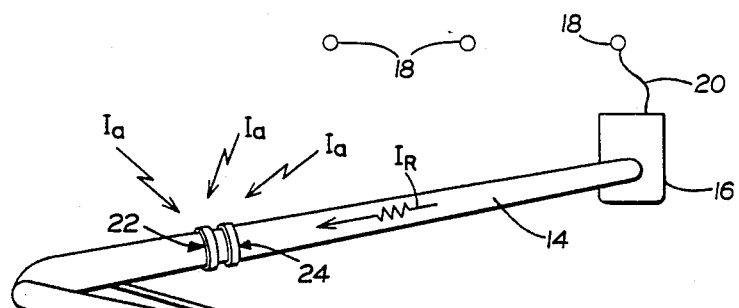
FIG. 1 is a schematic view of a utility truck having an aerial boom employing the preferred form of the present invention.

Refering now to the drawings and particularly to FIG. 1 there is shown therein a schematic view of an electrical utility truck generally indicated at 10. Truck 10 includes an aerial man lifting boom 12. Boom 12 is generally made of conductive material with the exception of a non-conductive rectangular insulating boom portion 14. At the upper end of boom 12 is a bucket 16 in which a worker performs tasks on nearby electrical lines 18. When work is being performed on the electrical lines, bucket 16 is normally bonded to the electric line 18 by a bonding cable 20. Cable 20 operates to assure that bucket 16 and the worker in it are at the same electrical potential as the line and thus, the worker is able to touch the line without electrical shock.

Insulating boom portion 14 is essential to the successful performance of work on the electrical line. As shown in FIG. 1, the lower portion of the truck and boom are grounded. If excessive current leaks through insulated boom portion 14, the worker in bucket 16 may receive a shock when coming in contact with the electrical line. Excessive current may also indicate the failing condition of the boom.

In the preferred form of the invention, a second metal collector band indicated generally at 22 extends around an outer portion of insulating boom 14 adjacent to the location where it is joined to the conductive lower portion of the boom. A first collector band indicated generally at 24 is mounted on the insulating boom portion 14 slightly closer to bucket 16. As shown schematically in FIG. 1, collector bands 22 and 24 are exposed to two sources of electrical current. The first current source is the ambient electrical current labeled $I_a$ in FIG. 1, which emanates from the nearby electrical lines to the collector bands and also partially leaks out of the collector bands to the ground and truck body or any other grounded object. The second source of electrical current is the leakage current labeled $I_R$ in FIG. 1 which travels down insulating boom portion 14 despite its electrically resistive properties. This electrical current leakage through the insulating boom portion can be effected by several things including the build-up of dirt and moisture on the insulating material.

There is also a small capacitive current which leaks through the insulating boom 14. This current is not believed to contain any more information about the integrity or safety of the insulating boom 14 than the resistive current. This small capacitive current, like the ambient capacitive currents, is stripped off the resistive electrical current by the compensation method and circuitry.

Figure 2:
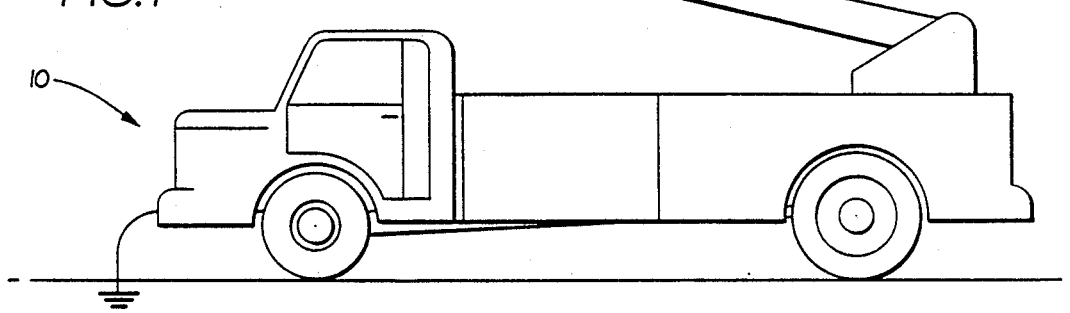
FIG. 2 is a partially sectioned schematic view of the insulating portion of the aerial boom shown in FIG. 1.

Details of the construction of collector bands 22 and 24 are shown in FIG. 2. Collector band 22 is an electrically conductive metal band 26 which extends around the outer perimeter of insulating boom portion 14 and is fastened thereto by rivets 28.

The first or primary collector band 24 is comprised of an outer metal band 30 which extends around the outer perimeter of boom portion 14 and an inner metal band 32 which extends about the inside perimeter of boom 14 below band 30. Bands 30 and 32 are electrically connected and fastened to boom portion 14 by conductive rivets 34.

Insulating boom portion 14 is hollow so that items such as rods, cables and hoses which are used to transmit boom control signals from the worker in the bucket to the lower portion on the boom can extend therethrough. These items are shown schematically in FIG. 2 and are generally referred to as control devices 36. While control devices which extend through the interior of the boom portion are made of non-conductive materials, they may still constitute paths of electrical current leakage. Electrically conductive collars 38 are mounted on the outside of the control devices and the collars are electrically connected to the inner bands 32 by cables 40. The assembly of outer and inner bands 30 and 32, rivets 34, collars 38 and cables 40 all make up the first collector band 24.

Second collector band 22 is connected by a shielded cable 42 to the convertor box 44. First collector band 24 is connected to the converter box 44 by shielded cable 46. The shielding on cables 42 and 46 are connected to ground to prevent the inner conductors in the cables from being influenced by the ambient electrical energy.

Converter box 44 is an enclosure for electrical components and is grounded to the lower conductive portion of boom 12 by a ground line 48. Converter box 44 has two outputs 50 and 52, which output voltage signals are representative of currents collected by the first and second collector bands as hereafter explained.

Figure 3:
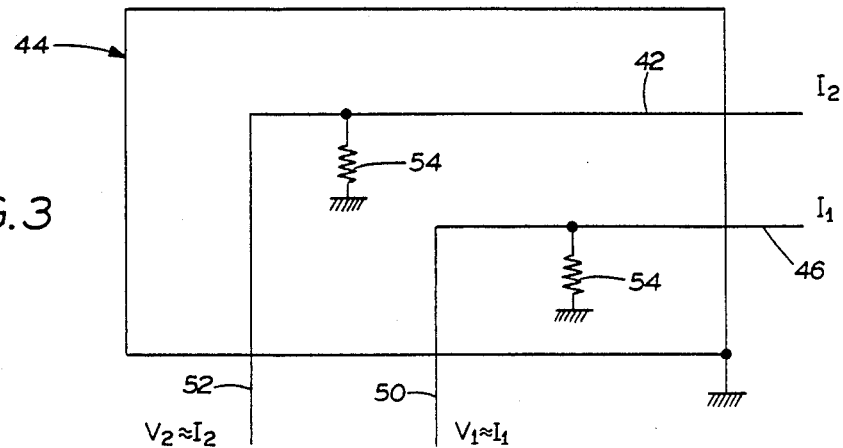
FIG. 3 is an electrical schematic of the converter box shown in FIG. 2.

The electrical schematic of the converter box 44 is shown in FIG. 3. A first current $I_1$ from the first collector band 24 enters the converter box through the conductive wire in cable 46. A second current $I_2$ from the second collector band 22 enters converter box 44 through cable 42. Both Currents $I_1$ and $I_2$ are directed to ground through identical resistors 54. Grounding resistors 54 serve to change the current signals on lines 46 and 42 which are $I_1$ and $I_2$ respectively, into first and second voltages representative thereof.

Figure 4:
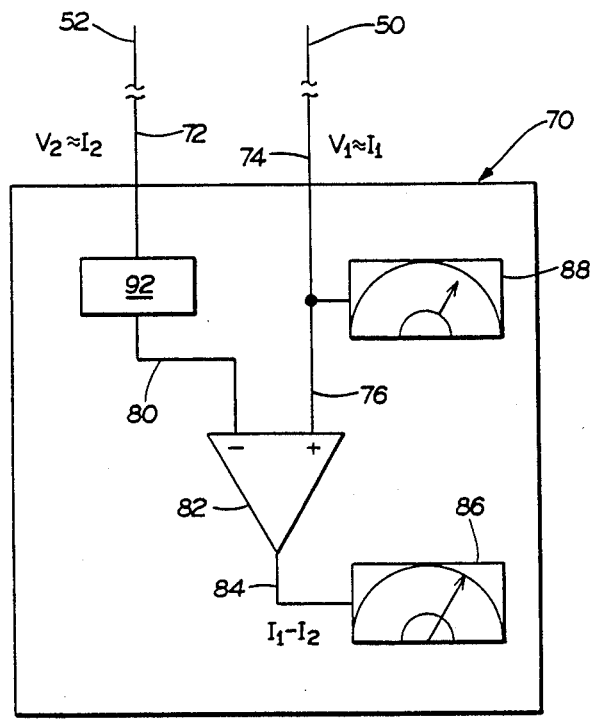
FIG. 4 is an electrical schematic of the elctronics and readout box of the preferred form of the invention.

The representative first and second voltages are extended from outputs 52 and 50 of converter box 44, down boom 12 to electronics and readout box 70 shown schematically in FIG. 4. Electronics and readout box 70 is preferably located on a lower portion of utility truck 10 in a location where it may be readily observed. As an option, to achieve transfer of these voltage signals from the converter box 44 to the electronics and readout box 70, the voltage signals may be converted into representative optical signals through a conventional electro/optic converter located in the electronics and readout box 70 through conventional optical cables.

The voltage signals on line 50 and 52 representative of $I_1$ and $I_2$ respectively, enter electronics and readout box 70 on cables 72 and 74. The voltage signal on line 72, representative of the capacitive current $I_2$ from the second collector band, is then passed through an adjustable gain circuit 92, which in the preferred form of the invention is a simple potentiometer. The adjusted voltage signal is outputted on line 80. The voltage signals on lines 76 and 80 are then passed through a conventional differential amplifier circuit 82 which serves to perform a vector subtraction of the voltage signals representative of $I_1$ and $I_2$ and output a resultant difference voltage signal on a line 84 which is output to a display circuit 86 shown schematically in FIG. 4. As an option, a digital multi-meter can be used as the electronics and readout box with an adjustable input potentiometer on the $I_2$ or negative input terminal.

The gain of the adjustable gain circuit 92 is set such that the difference voltage signal on line 84 should become as small as possible. In this mode, when the difference voltage signal is at its minimum value, the adjusted ambient capacitive current $I_2$ is identical to the ambient capacitive current of $I_1$. Subtracting adjusted $I_2$ from $I_1$ cancels out the undesirable ambient capacitive current leaving only the resistive current leaking through the insulating portion 14 of the utility truck 10.

In the preferred form of the invention, display circuit 86 receives the resultant difference voltage and outputs, on a digital display, an accurate indication of the amount of the resistive leakage current traveling down the insulating boom portion 14 without influence by ambient capacitive coupling.

The voltage signal on line 76 representative of the electrical current collected by the first set of collector bands, is input to a total current display circuit 88, which is similar to display circuit 86. This is the total electrical current at the first set of collector bands. The difference between the readings provided at the readouts of display circuits 86 and 88 gives the user an indication of the amount of ambient capacitive current present in the area of the boom.

Figure 5:
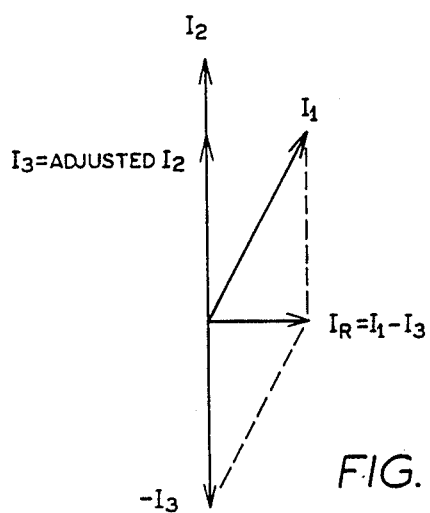
FIG. 5 is a schematic of current vectors representative of the currents collected by tee first and second collector bands of the preferred form of the invention.

When the boom is in operation, the first set of collector bands 24 intercepts the electrical energy that leaks down the insulating boom portion from the electric line in contact with the bucket as well as the ambient electrical energy, which eminates from nearby electrical lines. This is a total current $I_1$ shown schematically as a current vector in FIG. 5. The current collected by the second collector band 22 is only ambient capacitive current $I_2$ which does not include resistive leakage down the boom, as such leakage is intercepted in advance of the second collector band by the first set of collector bands. Depending on the relative sizes of the first and second collector bands, the magnitudes of the ambient capacitive currents received by these electrodes may not be equal. The variable gain circuit 92 adjusts the current $I_2$ from the second collector band to $I_3$ which is equal to the ambient capacitive current received by the first electrode band. The vector current difference between $I_3$ and $I_1$ is therefore the resistive current which is leaking down the insulating boom portion, and it is the magnitude of this resistive current that the invention displays to the user.

Figure 6:
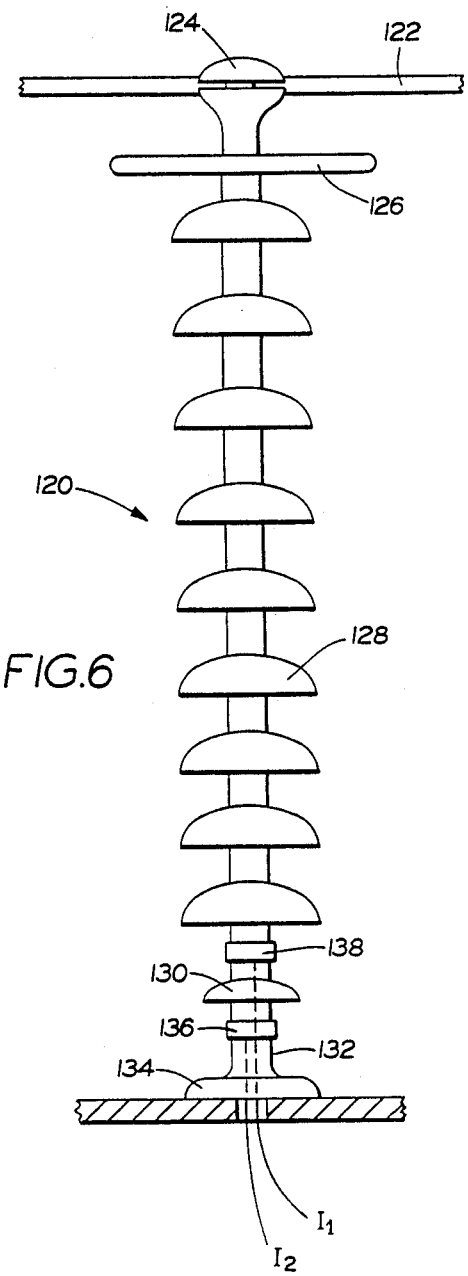
FIG. 6 is a schematic view of an electrical insulator including an alternative embodiment of the present invention for measuring current leakage through the insulator.

FIG. 6 shown an alternative embodiment of the the invention applied to an electrical insulator of the type used on electrical transmission towers and substations. An electrical insulator, generally indicated at 120, is shown connected to an electrical bus or power line 122 at a juction 124. A conventional ring structure 126 is mounted to the eyelet. The eyelet is supported by the main isulating body portion 128 of the insulator. A small middle insulating body portion 130 is positioned between the main insulating body portion 128 and a lower insulating body portion 132. Lower insulating body portion 132 is attached to an adjacent grounded structure 134 at its lower end.

Mounted between insulating body portions 128 and 130 is a first collector band 138. Similarly, mounted between body portion 132 and 130 is a second collector band 136. Collector bands 136 and 138 may be in the form of metal hardware connecting insulators 128, 130 and 132 together, and function similar to first and second collector bands 22 and 24 of the embodiment previously described.

First collector band 138 collects the electrical current leakage through the main body portion 128 as well as ambient capacitive coupled electrical currents. Second collector band 136 collects only ambient capacitive currents, as the resistive current leakage is collected by first collector band 138. Resistive current leakage through the main portion of the insulator is determined by attaching the collector bands to the measuring equipment. The electrical paths from the plates to the measuring equipment can be run through an interior portion of the insulating parts 130 and 132 using shielded cable. This is accomplished by providing second collector band 136 with an access hole for passing the cable from the first collector band 138 therethrough. The shielded cables from both collector bands pass out the underside of the insulator to the measuring equipment mounted on grounded structure 134.

Thus, the new apparatus and method for detecting resistive current leakage through insulating structures, achieves the above stated objectives, eliminates difficulties encountered in the use of prior device, and solves problems, and obtains the desirable results described herein.

In the foregoing description, certain terms have been used for brevity, clairity, and understanding, however, no unneccessary limitations are to be implied therefrom because such terms are for descriptive purposes and are intended to be broadly construed. Moreover the description and illustrations given are by way of example and the invention is not limited to the exact details shown or described.

Having described the features, discoveries, and principles of the invention, the manner in which it is constructed and operated and the advantages and useful results obtained, the new and useful structures, devices, elements, arrangements, parts, combinations, systems, equipment operations and relationships are set forth in the appended claims.

What is claimed is:

1. Apparatus for determining the electrical resistive leakage current through an electrically insulating structure in contact with a source of electrical energy at a location in proximity to single or multiphase sources of varying and unknown extraneous ambient capacitively coupled electrical current, said apparatus including:
   (a) a first collector band mounted on said structure to collect a first current comprising the resistive leakage current mixed with a first ambient capacitively coupled current;
   (b) a second collector band mounted on said structure located proximate to and electrically behind said first band to collect a second current comprising a second ambient capacitively coupled current;
   (c) first current path means for conducting the first current from said first collector band to a ground;
   (d) second current path means for conducting the second current from said second collector band to a ground;
   (e) first means for converting the first and second currents to first and second voltages each containing capacitive components proportional to the capacitively coupled currents; and
   (f) second means for subtracting the capacitive components to provide a resultant voltage substantially free of any capacitive component and representative of the resistive leakage current in the insulating structure.

2. The apparatus according to claim 1 wherein said electrically insulating structure is an electrically resistive hollow boom portion of a man lifting machine.

3. The apparatus according to claim 2 wherein said first collector band comprises an outer metal band extending about the resistive boom portion on an outside perimeter, and an inner metal band extending about an inner perimeter below said outer metal band, said inner and outer metal bands being in electrical connection.

4. The apparatus according to claim 3 wherein said inner and outer bands of said first collector band are electrically connected by conductive fasteners passing through said resistive boom portion.

5. The apparatus according to claim 4 wherein a plurality of control devices extend longitudinally through said hollow resistive boom portion and said first collector band on each of said control devices proximate of said inner and outer metal bands and in electrical connection therewith.

6. The apparatus according to claim 2 wherein said second collector band is a metal band extending about the boom on an outside perimeter adjacent to a mounting location where said insulating boom portion joins an electrically conductive lower portion of said man lifting machine.

7. The apparatus according to claim 6 wherein said first and second collector bands are electrically connected to the first and second means by first and second shielded cables respectively, the shielding of said cables being connected to ground.

8. The apparatus according to claim 7 wherein said first and second means is separately grounded and said first and second current path means are electrical paths through said first and second shielded cables respective to ground.

9. A method for determining the amount of resistive current leakage flowing through an electrically insulating structure in contact with a source of electrical energy at a location in proximity to single phase or multiphase sources of varying extraneous capacitively coupled ambient electrical current surrounding said structure; comprising the steps of:
   (a) obtaining a first electrical current by collecting both the resistive leakage current flowing through the insulating structure and the ambient capacitively coupled current by a first collector band on said structure and conducting said first current to ground;
   (b) obtaining a second electrical current by collecting only the ambient capacitively coupled current in a second collector band on said structure and conducting said ambient electrical current to ground;
   (c) converting the first and second currents from the collector bands to proportioned first and second voltage signals, respectively, each of said voltage signals containing a capacitive component;
   (d) equalizing the capacitive component of the first and second voltage signals; and
   (e) subtracting the second capacitive voltage component from the first capacitive voltage component to cancel out the capacitive voltage component from the first voltage signal to provide a purely resistive voltage component representative of the resistive current leakage flowing through the electrically insulating structure.

10. The method defined in claim 9 in which the equalizing step includes passing the first and second currents through grounding resistors which are selected to compensate for any differences in the capacitively components of the currents in the first and second collector bands.

11. The apparatus according to claim 10 wherein the first means comprises grounding resistors with the first and second voltages being developed across said two grounding resistors.

12. The apparatus according to claim 11 wherein the size of the grounding resistors are selected to equalize any unbalance between the capacitively coupled currents in the two collector bands whereby the first and second voltages will contain substantially equal amounts of a capacitive component proportional to the capacitively coupled ambient current surrounding the insulating structure.

* * * * *